(12) United States Patent
Kanaya et al.

(10) Patent No.: US 11,296,007 B2
(45) Date of Patent: Apr. 5, 2022

(54) THERMAL CONDUCTING SHEET, METHOD FOR MANUFACTURING THERMAL CONDUCTING SHEET, HEAT DISSIPATION MEMBER, AND SEMICONDUCTOR DEVICE

(71) Applicant: Dexerials Corporation, Tokyo (JP)

(72) Inventors: Hiroki Kanaya, Tokyo (JP); Shinichi Uchida, Tokyo (JP); Keisuke Aramaki, Tokyo (JP)

(73) Assignee: Dexerials Corporation, Tokyo (JP)

( * ) Notice: Subject to any disclaimer, the term of this patent is extended or adjusted under 35 U.S.C. 154(b) by 134 days.

(21) Appl. No.: 16/069,946

(22) PCT Filed: Jan. 13, 2017

(86) PCT No.: PCT/JP2017/001121
§ 371 (c)(1),
(2) Date: Jul. 13, 2018

(87) PCT Pub. No.: WO2017/122817
PCT Pub. Date: Jul. 20, 2017

(65) Prior Publication Data
US 2019/0019739 A1 Jan. 17, 2019

(30) Foreign Application Priority Data

Jan. 14, 2016 (JP) .............................. JP2016-005400
Dec. 27, 2016 (JP) .............................. JP2016-254243

(51) Int. Cl.
*H01L 23/367* (2006.01)
*H01L 23/373* (2006.01)
(Continued)

(52) U.S. Cl.
CPC ........ *H01L 23/3677* (2013.01); *B32B 27/283* (2013.01); *B32B 38/0004* (2013.01);
(Continued)

(58) Field of Classification Search
CPC ............ B32B 27/283; B32B 2307/302; B32B 38/0004; C08K 2003/2227;
(Continued)

(56) References Cited

U.S. PATENT DOCUMENTS

| 5,698,286 A * | 12/1997 | Ikarashi ................ G11B 5/733 428/840.3 |
| 2004/0209109 A1 * | 10/2004 | Tsuchida ................ C23C 28/00 428/626 |

(Continued)

FOREIGN PATENT DOCUMENTS

| CN | 1791636 | 6/2006 |
| CN | 1800921 | 7/2006 |

(Continued)

OTHER PUBLICATIONS

Korean Patent Office, Office Action issued for corresponding Korean Patent Application No. 10-2018-7002672, dated May 18, 2018.

(Continued)

*Primary Examiner* — Vongsavanh Sengdara
(74) *Attorney, Agent, or Firm* — Carmody Torrance Sandak & Hennessey LLP

(57) ABSTRACT

Provided is a thermal conducting sheet, including: a binder resin; insulating-coated carbon fibers; and a thermal conducting filler other than the insulating-coated carbon fibers, wherein the insulating-coated carbon fibers include carbon fibers and a coating film over at least a part of a surface of the carbon fibers, the coating film being formed of a cured product of a polymerizable material.

15 Claims, 2 Drawing Sheets

(51) Int. Cl.
  *C08K 9/08* (2006.01)
  *C08K 3/28* (2006.01)
  *H01L 23/42* (2006.01)
  *C08K 3/22* (2006.01)
  *C08L 83/04* (2006.01)
  *B32B 27/28* (2006.01)
  *B32B 38/00* (2006.01)
  *H01L 21/48* (2006.01)

(52) U.S. Cl.
  CPC .................. *C08K 3/22* (2013.01); *C08K 3/28* (2013.01); *C08K 9/08* (2013.01); *C08L 83/04* (2013.01); *H01L 23/373* (2013.01); *H01L 23/3737* (2013.01); *H01L 23/42* (2013.01); *B32B 2307/302* (2013.01); *C08K 2003/2227* (2013.01); *C08K 2003/2296* (2013.01); *C08K 2003/282* (2013.01); *H01L 21/4871* (2013.01); *H01L 2224/73253* (2013.01); *H01L 2924/16152* (2013.01)

(58) Field of Classification Search
  CPC ...... C08K 2003/2296; C08K 2003/282; C08K 3/04; C08K 3/22; C08K 3/28; C08K 9/08; C08L 83/04; H01L 21/4871; H01L 2224/73253; H01L 23/3677; H01L 23/373; H01L 23/3727; H01L 23/42; H01L 2924/16152
  See application file for complete search history.

(56) References Cited

U.S. PATENT DOCUMENTS

| | | | |
|---|---|---|---|
| 2006/0154395 A1 | 7/2006 | Kim | |
| 2015/0118505 A1 | 4/2015 | Aramaki | |
| 2016/0118316 A1 | 4/2016 | Aramaki et al. | |
| 2016/0150680 A1* | 5/2016 | Aramaki | H01L 23/3737 165/133 |

FOREIGN PATENT DOCUMENTS

| | | |
|---|---|---|
| CN | 103764733 | 4/2014 |
| JP | 48-068892 | 9/1973 |
| JP | 05-235217 | 9/1993 |
| JP | 2004-218144 | 8/2004 |
| JP | 2012-001638 | 1/2012 |
| JP | 4920135 | 2/2012 |
| JP | 4973569 | 4/2012 |
| JP | 5166689 | 12/2012 |
| JP | 2013-007124 | 1/2013 |
| JP | 2013-122003 | 6/2013 |
| JP | 2013-225636 | 10/2013 |
| JP | 2015-029076 | 2/2015 |
| JP | 2015-035580 | 2/2015 |
| KR | 10-2006-0006033 | 1/2006 |
| TW | 201118121 | 6/2011 |
| WO | 2004094529 | 11/2004 |
| WO | 2011013840 | 2/2011 |
| WO | 2017026428 | 2/2017 |

OTHER PUBLICATIONS

Korean Patent Office, Office Action issued for corresponding Korean Patent Application No. 10-2018-7002672, dated Aug. 22, 2018.
Japanese Patent Office, Japanese First Office Action issued in corresponding Japanese application No. 2016-254243, dated Aug. 8, 2017.
The State Intellectual Property Office of People's Republic of China, First Office Action dated Sep. 10, 2018 in corresponding Chinese Application No. 201780002820.6.
The State Intellectual Property Office of People's Republic of China, Second Office Action for corresponding Chinese application No. 201780002820.6, dated Apr. 16, 2019.
Taiwanese Patent Office, Office Action issued in corresponding Taiwanese Application No. 106101094 dated May 28, 2020.

* cited by examiner

THERMAL CONDUCTING SHEET, METHOD FOR MANUFACTURING THERMAL CONDUCTING SHEET, HEAT DISSIPATION MEMBER, AND SEMICONDUCTOR DEVICE

TECHNICAL FIELD

The present invention relates to a thermal conducting sheet disposed between a heat generator such as a semiconductor element and a heat dissipator such as a heat sink, a method for producing a thermal conducting sheet, and a heat dissipation member and semiconductor device including the thermal conducting sheet.

BACKGROUND ART

Hitherto, various cooling measures have been employed in semiconductor elements mounted on various electrical appliances such as personal computers and other devices, because if heat generated as a result of driving is accumulated, driving of the semiconductor elements and peripheral devices may be adversely affected. As a method for cooling electronic parts such as semiconductor elements, there are known, for example, a method of mounting the device with a fan to cool the air in the device housing, and a method of mounting the semiconductor element to be cooled with a heat sink such as a heat dissipation fin and a heat dissipation plate.

When cooling the semiconductor element by mounting it with a heat sink, a thermal conducting sheet is provided between the semiconductor element and the heat sink in order to efficiently dissipate heat in the semiconductor element. As this thermal conducting sheet, a sheet obtained by adding a filler such as a thermal conducting filler in a dispersed state in a silicone resin is widely used. As one such thermal conducting filler, carbon fibers are favorably employed (for example, see PTL 1).

However, the problem of the carbon fibers mentioned above is their high electrical conductivity, although they have an excellent thermal conductivity. Hence, when the thermal conducting sheet containing the carbon fibers contacts the circuits surrounding the semiconductor element or when the sheet is chipped and falls into the circuits, short-circuiting may be caused by the carbon fibers exposed on the surface of the sheet. For such reasons, there is a risk of breakdown of the electronic parts.

Hence, in order to enhance the insulating property of the carbon fibers, techniques for insulating-coating the carbon fibers have been developed.

For example, there have been disclosed techniques for insulating-coating the carbon fibers with resins (for example, see PTLs 2 and 3).

Furthermore, there have been disclosed techniques for insulating-coating the carbon fibers with inorganic materials (for example, see PTLs 4 to 8).

However, because the techniques of PTLs 2 and 3 produce carbon fibers by immersion of the carbon fibers in a dissolved resin, there are problems that the insulating-coated carbon fibers aggregate with each other to have a degraded thermal conductivity, and that a sufficient insulating property cannot be realized.

The techniques of PTLs 4 to 8 have a problem that insulating-coating with inorganic materials cannot ensure a sufficient insulating property.

CITATION LIST

Patent Literature

PTL 1: Japanese Patent Application Laid-Open (JP-A) No. 2012-001638
PTL 2: International Publication No. WO 2011/013840
PTL 3: JP-A No. 2013-007124
PTL 4: Japanese Patent (JP-B) No. 4973569
PTL 5: JP-A No. 2013-122003
PTL 6: JP-A No. 2004-218144
PTL 7: JP-B No. 5166689
PTL 8: JP-B No. 4920135

SUMMARY OF INVENTION

Technical Problem

The present invention aims for solving the various problems in the related art and achieving an object described below. That is, the present invention has an object to provide a thermal conducting sheet having a high thermal conductivity and an excellent insulating property at the same time, a method for producing the same, and a heat dissipation member and semiconductor device using the thermal conducting sheet.

Solution to Problem

Means for solving the above problems are as follows.
<1> A thermal conducting sheet, including:
a binder resin;
insulating-coated carbon fibers; and
a thermal conducting filler other than the insulating-coated carbon fibers,
wherein the insulating-coated carbon fibers include carbon fibers and a coating film over at least a part of a surface of the carbon fibers, the coating film being formed of a cured product of a polymerizable material.
<2> The thermal conducting sheet according to <1>,
wherein the polymerizable material includes a compound having 2 or more radically polymerizable double bonds.
<3> The thermal conducting sheet according to <1> or <2>,
wherein an average thickness of the coating film observed when a cross-section of the coating film is observed with a TEM is 100 nm or greater.
<4> The thermal conducting sheet according to any one of <1> to <3>,
wherein a volume resistivity of the thermal conducting sheet at an applied voltage of 1,000 V is $1.0\times10^{10}$ Ω·cm or higher.
<5> The thermal conducting sheet according to any one of <1> to <4>,
wherein a compressibility of the thermal conducting sheet at a load of 0.5 kgf/cm$^2$ is 3% or higher.
<6> The thermal conducting sheet according to any one of <1> to <5>,
wherein the thermal conducting filler includes at least any one selected from the group consisting of aluminum oxide, aluminum nitride, and zinc oxide.
<7> The thermal conducting sheet according to any one of <1> to <6>,
wherein the binder resin is a silicone resin.
<8> A method for producing a thermal conducting sheet, the method including:
a step of molding a thermal conducting resin composition including a binder resin, insulating-coated carbon fibers, and a thermal conducting filler other than the insulating-coated carbon fibers into a predetermined shape and curing a resultant to obtain a molded body of the thermal conducting resin composition; and a step of cutting the molded body into a sheet shape to obtain a sheet of the molded body, wherein the insulating-coated carbon fibers include carbon fibers and a coating film over at least a part of a surface of the carbon fibers, the coating film being formed of a cured product of a polymerizable material.

<9> The method for producing a thermal conducting sheet according to <8>, wherein the polymerizable material is a radically polymerizable material.

<10> The method for producing a thermal conducting sheet according to <8> or <9>, further including:

a step of applying an energy to a mixture obtained by mixing the polymerizable material, the carbon fibers, a polymerization initiator, and a solvent to activate the polymerization initiator to thereby form the coating film formed of the cured product of the polymerizable material over at least the part of the surface of the carbon fibers to obtain the insulating-coated carbon fibers.

<11> A heat dissipation member, including:

a heat spreader configured to dissipate heat generated by an electronic part; and the thermal conducting sheet according to any one of <1> to <7> provided on the heat spreader and interposed between the heat spreader and the electronic part.

<12> A semiconductor device, including:

an electronic part;

a heat spreader configured to dissipate heat generated by the electronic part; and the thermal conducting sheet according to any one of <1> to <7> provided on the heat spreader and interposed between the heat spreader and the electronic part <13> The semiconductor device according to <12>, further including:

a heat sink, wherein the thermal conducting sheet according to any one of <1> to <7> is interposed between the heat spreader and the heat sink.

Advantageous Effects of Invention

The present invention can solve the various problems in the related art, achieve the object described above, and provide a thermal conducting Sheet having a high thermal conductivity and an excellent insulating property at the same time, a method for producing the same, and a heat dissipation member and semiconductor device using the thermal conducting sheet.

DESCRIPTION OF EMBODIMENTS (Thermal Conducting Sheet)

Figure 1:
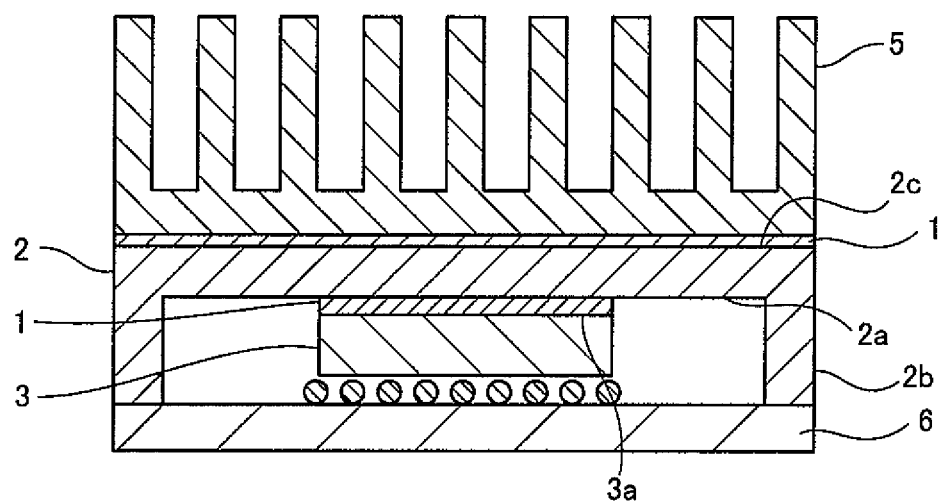
FIG. 1 is a cross-sectional view illustrating a thermal conducting sheet, a heat dissipation member, and a semiconductor device to which the present invention is applied.

A thermal conducting sheet of the present invention includes at least a binder resin, insulating-coated carbon fibers, and a thermal conducting filler, and further contains other components as needed.

<Binder Resin>

The binder resin is not particularly limited and may be appropriately selected depending on the intended purpose. Examples of the binder resin include thermosetting polymers.

Examples of the thermosetting polymers include cross-linked rubbers, epoxy resins, polyimide resins, bismaleimide resins, benzocyclobutene resins, phenol resins, unsaturated polyester, diallyl phthalate resins, silicone resins, polyurethane, polyimide silicone, thermosetting polyphenylene ether, and thermosetting modified polyphenylene ether. One of these thermosetting polymers may be used alone or two or more of these thermosetting polymers may be used in combination.

Examples of the cross-linked rubbers include natural rubbers, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. One of these cross-linked rubbers may be used alone or two or more of these cross-linked rubbers may be used in combination.

Among these examples, a silicone resin is particularly preferable as the thermosetting polymer, because of an excellent molding processability and an excellent weatherability and in terms of close adhesiveness and conformity with an electronic part.

The silicone resin is not particularly limited and may be appropriately selected depending on the intended purpose. It is preferable that the silicone resin contain a main agent formed of a liquid silicone gel, and a curing agent. Examples of such a silicone resin include addition-reactive silicone resins and thermally-vulcanizable minable silicone resins to be vulcanized with peroxides. Among these silicone resins, addition-reactive silicone resins are particularly preferable because the thermal conducting sheet needs to have close adhesiveness with a heat generating surface of an electronic part and with a heat sink surface.

As the addition-reactive silicone resin, a two-pack addition-reactive silicone resin containing vinyl group-containing polyorganosiloxane as a main agent and Si—H group-containing polyorganosiloxane as a curing agent is preferable.

The blending ratio between the main agent and the curing agent in the combination of the liquid silicone gel main agent and the curing agent is not particularly limited and may be appropriately selected depending on the intended purpose.

The content of the binder resin is not particularly limited, may be appropriately selected depending on the intended purpose, and is preferably from 10% by volume through 50% by volume, more preferably from 15% by volume through 40% by volume, and particularly preferably from 30% by volume through 40% by volume.

<Insulating-Coated Carbon Fibers>

The insulating-coated carbon fibers include at least carbon fibers and a coating film provided over at least a part of a surface of the carbon fibers, and further include other components as needed.

The coating film is formed of a cured product of a polymerizable material.

—Carbon Fibers—

The carbon fibers are not particularly limited and may be appropriately selected depending on the intended purpose. Examples of the carbon fibers include pitch-based carbon fibers, PAN-based carbon fibers, carbon fibers formed of graphitized PBO fibers, and carbon fibers synthesized by, for example, an arc discharge method, a laser evaporation method, a CVD method (chemical vapor deposition method), and a CCVD method (catalytic chemical vapor deposition method). Among these carbon fibers, carbon fibers formed of graphitized PBO fibers and pitch-based carbon fibers are particularly preferable in terms of thermal conductivity.

The carbon fibers can be used in a state that a part or the whole of each carbon fiber are surface-treated, in order to have a high close adhesiveness with the coating film. Examples of the surface treatment include an oxidation treatment, a nitriding treatment, nitration, and sulfonation, or a treatment for attaching or bonding, for example, a metal, a metal compound, or an organic compound to a functional group introduced into the surface by these treatments or to the surface of the carbon fibers. Examples of the functional group include a hydroxyl group, a carboxyl group, a carbonyl group, a nitro group, and an amino group.

The average fiber length (average longer-axis length) of the carbon fibers is not particularly limited, may be appropriately selected depending on the intended purpose, and is preferably from 50 micrometers through 250 micrometers, more preferably from 75 micrometers through 200 micrometers, and particularly preferably from 90 micrometers through 170 micrometers.

The average fiber diameter (average shorter-axis length) of the carbon fibers is not particularly limited, may be appropriately selected depending on the intended purpose, and is preferably from 4 micrometers through 20 micrometers and more preferably from 5 micrometers through 14 micrometers.

The aspect ratio (average longer-axis length/average shorter-axis length) of the carbon fibers is not particularly limited, may be appropriately selected depending on the intended purpose, and is preferably 8 or greater and more preferably from 9 through 30. When the aspect ratio is less than 8, the thermal conductivity may be poor because the fiber length (longer-axis length) of the carbon fibers is short.

Here, the average longer-axis length and the average shorter-axis length of the carbon fibers can be measured with, for example, a microscope and a scanning electron microscope (SEM).

—Cured Product of Polymerizable Material—

The cured product of the polymerizable material is obtained by curing the polymerizable material. In other words, the cured product is a polymer product of the polymerizable material.

The polymerizable material is not particularly limited and may be appropriately selected depending on the intended purpose so long as the polymerizable material is an organic material having polymerizability. Examples of the polymerizable material include organic compounds having polymerizability and resins having polymerizability.

Examples of polymerization which the polymerizable material will undergo include radical polymerization, cationic polymerization, and anionic polymerization. Among these polymerizations, radical polymerization is preferable because there are many kinds of applicable polymerizable materials, polymerization initiators, and solvents and various cured products can be obtained.

That is, it is preferable that the polymerizable material be a radically polymerizable material.

—Radically Polymerizable Material—

The radically polymerizable material is not particularly limited and may be appropriately selected depending on the intended purpose so long as the radically polymerizable material is a material that undergoes radical polymerization through utilization of an energy. Examples of the radically polymerizable material include a compound containing a radically polymerizable double bond.

Examples of the radically polymerizable double bond include a vinyl group, an acryloyl group, and a methacryloyl group.

The number of radically polymerizable double bonds in the compound containing the radically polymerizable double bond is preferably 2 or more in terms of coating film strength including heat resistance and solvent resistance. That is, it is preferable that the compound containing the radically polymerizable double bond contain at least 1 or more kinds of compounds containing 2 or more radically polymerizable double bonds.

Examples of the compound containing 2 or more radically polymerizable double bonds include divinylbenzene and a compound containing 2 or more (meth)acryloyl groups.

Examples of the compound containing 2 or more (meth)acryloyl groups include ethylene glycol di(meth)acrylate, (poly)ethylene glycol di(meth)acrylate, propylene glycol di(meth)acrylate, (poly)propylene glycol di(meth)acrylate, pentaerythritol tetra(meth)acrylate, pentaerythritol tri(meth)acrylate, pentaerythritol di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, 1,6-hexanediol di(meth)acrylate, neopentyl glycol di(meth)acrylate, tetramethylolmethane tri((meth)acrylate, tetramethylolpropane tetra(meth)acrylate, tricyclodecane dimethanol di(meth)acrylate, and (poly)ethoxylated bisphenol A di(meth)acrylate.

Here, the (meth)acryloyl group is the general term of an acryloyl group and a methacryloyl group, and (meth)acrylate is the general term of acrylate and methacrylate.

One of the radically polymerizable materials may be used alone or two or more of the radically polymerizable materials may be used in combination.

The molecular weight of the radically polymerizable material is not particularly limited, may be appropriately selected depending on the intended purpose, and is preferably from 50 through 500.

The content of a structural unit attributable to the polymerizable material in the cured product and the coating film is not particularly limited, may be appropriately selected depending on the intended purpose, and is preferably 50% by mass or greater and more preferably 90% by mass or greater.

The average thickness of the coating film of the insulating-coated carbon fibers is not particularly limited, may be appropriately selected depending on the intended purpose, and is preferably 50 nm or greater, more preferably 100 nm or greater, and particularly preferably 200 nm or greater in terms of realizing a high insulating property. The upper limit of the average thickness of the coating film is not particularly limited and may be appropriately selected depending on the intended purpose. For example, the average thickness is preferably 1,000 nm or less and more preferably 500 mm or less.

The average thickness can be obtained by, for example, transmission electron microscopic (TEM) observation.

In the thermal conducting sheet, the insulating-coated carbon fibers need not have the coating film on the ends thereof in the longer direction. Particularly, there may be a case where the thermal conducting sheet is produced by slicing a block-shaped molded body. Therefore, in the surfaces of the thermal conducting sheet, the insulating-coated carbon fibers need not have the coating film on the ends thereof in the longer direction.

The content of the insulating-coated carbon fibers is not particularly limited, may be appropriately selected depending on the intended purpose, and is preferably from 10% by volume through 40% by volume, more preferably from 12% by volume through 38% by volume, and particularly preferably from 15% by volume through 30% by volume. When the content of the insulating-coated carbon fibers is less than 10% by volume, it may be difficult to obtain a sufficiently low thermal resistance. When the content of the insulating-coated carbon fibers is greater than 40% by volume, moldability of the thermal conducting sheet and orientation of the insulating-coated carbon fibers may be affected.

The method for producing the insulating-coated carbon fibers is not particularly limited and may be appropriately selected depending on the intended purpose. Examples of the method include an insulating-coated carbon fiber producing step described below.

<Thermal Conducting Filler>

The thermal conducting filler is not particularly limited and may be appropriately selected so long as the thermal conducting filler is a thermal conducting filler other than the insulating-coated carbon fibers. Examples of the thermal conducting filler include an inorganic filler.

For example, the shape, material, and average particle diameter of the inorganic filler are not particularly limited and may be appropriately selected depending on the intended purpose. The shape is not particularly limited and may be appropriately selected depending on the intended purpose, and examples of the shape include a spherical shape, an ellipsoidal shape, a block shape, a grainy shape, a flat shape, and an acicular shape. Among these shapes, a spherical shape and an ellipsoidal shape are preferable in terms of fillability and a spherical shape is particularly preferable.

In the present specification, the inorganic filler is different from the insulating-coated carbon fibers and the carbon fibers.

Examples of the inorganic filler include aluminum nitride (MN), silica, aluminum oxide (alumina), boron nitride, titania, glass, zinc oxide, silicon carbide, silicon, silicon oxide, aluminum oxide, and metal particles. One of these inorganic fillers may be used alone or two or more of these inorganic fillers may be used in combination. Among these inorganic fillers, aluminum oxide, boron nitride, aluminum nitride, zinc oxide, and silica are preferable, and in terms of thermal conductivity, aluminum oxide, aluminum nitride, and zinc oxide are particularly preferable.

The inorganic filler may be surface-treated. When the inorganic filler is treated with a coupling agent for the surface treatment, the inorganic filler has an improved dispersibility and the thermal conducting sheet has an improved flexibility.

The average particle diameter of the inorganic filler is not particularly limited and may be appropriately selected depending on the intended purpose.

When the inorganic filler is alumina, the average particle diameter thereof is preferably from 1 micrometer through 10 micrometers, more preferably from 1 micrometer through 5 micrometers, and particularly preferably from 3 micrometers through 5 micrometers. When the average particle diameter of the alumina is less than 1 micrometer, the inorganic filler may have a high viscosity and may not mix well. When the average particle diameter of the alumina is greater than 10 micrometers, the thermal conducting sheet may have a high thermal resistance.

When the inorganic filler is aluminum nitride, the average particle diameter thereof is preferably from 0.3 micrometers through 6.0 micrometers, more preferably from 0.3 micrometers through 2.0 micrometers, and particularly preferably from 0.5 micrometers through 1.5 micrometers. When the average particle diameter of the aluminum nitride is less than 0.3 micrometers, the inorganic filler may have a high viscosity and may not mix well. When the average particle diameter of the aluminum nitride is greater than 6.0 micrometers, the thermal conducting sheet may have a high thermal resistance.

The average particle diameter of the inorganic filler can be measured with, for example, a particle size distribution meter and a scanning electron microscope (SEM).

The content of the thermal conducting filler is not particularly limited, may be appropriately selected depending on the intended purpose, and is preferably from 25% by volume through 65% by volume, more preferably from 30% by volume through 60% by volume, and particularly preferably from 35% by volume through 55% by volume. When the content of the thermal conducting filler is less than 25% by volume, the thermal conducting sheet may have a high thermal resistance. When the content of the thermal conducting filler is greater than 60% by volume, the thermal conducting sheet may have a poor flexibility.

<Other Components>

The other components are not particularly limited and may be appropriately selected depending on the intended purpose. Examples of the other components include a thixotropic nature imparting agent, a dispersant, a curing accelerator, a retarder, a slight adhesiveness imparting agent, a plasticizer, a flame retardant, an antioxidant, a stabilizer, and a colorant.

The average thickness of the thermal conducting sheet is not particularly limited, may be appropriately selected depending on the intended purpose, and is preferably from 0.05 mm through 5.00 mm, more preferably from 0.07 mm through 4.00 mm, and particularly preferably from 0.10 mm through 3.00 mm.

It is preferable that the surface of the thermal conducting sheet be coated with a bled-out component that has bled out from the thermal conducting sheet conformally to the bossed shapes of the insulating-coated carbon fibers that are protruding.

As the method for obtaining this state of the surface of the thermal conducting sheet, for example, a press step described below may be performed.

The volume resistivity of the thermal conducting sheet at an applied voltage of 1,000 V is preferably $1.0 \times 10^{10} \Omega \cdot cm$ or higher in terms of preventing short-circuiting of an electronic circuit located around the semiconductor element used. The volume resistivity is measured according to, for example, JIS K-6911. The upper limit of the volume resistivity is not particularly limited and may be appropriately selected depending on the intended purpose. For example, the volume resistivity may be $1.0 \times 10^{18} \Omega \cdot cm$ or lower.

The compressibility of the thermal conducting sheet at a load of $0.5 \text{ kgf/cm}^2$ is preferably 3% or higher and more preferably 5% or higher in terms of close adhesiveness with an electronic part and with a heat sink.

The upper limit of the compressibility of the thermal conducting sheet is not particularly limited and may be appropriately selected depending on the intended purpose. The compressibility of the thermal conducting sheet is preferably 30% or lower.

(Method for Producing Thermal Conducting Sheet)

A method for producing the thermal conducting sheet of the present invention includes at least a molded body producing step and a molded body sheet producing step, preferably includes an insulating-coated carbon fiber producing step and a surface coating step, and further includes other steps as needed.

<Molded Body Producing Step>

The molded body producing step is not particularly limited and may be appropriately selected depending on the intended purpose, so long as the molded body producing step is a step of molding a thermal conducting resin composition including a binder resin, insulating-coated carbon fibers, and a thermal conducting filler into a predetermined shape and curing the resultant to obtain a molded body of the thermal conducting resin composition.

—Thermal Conducting Resin Composition—

The thermal conducting resin composition includes at least a binder resin, insulating-coated carbon fibers, and a thermal conducting filler and further includes other components as needed.

Examples of the binder resin include the binder resin raised as examples in the description of the thermal conducting sheet.

Examples of the insulating-coated carbon fibers include the insulating-coated carbon fibers raised as examples in the description of the thermal conducting sheet.

Examples of the thermal conducting filler include the thermal conducting filler raised as examples in the description of the thermal conducting sheet.

The method for molding the thermal conducting resin composition into a predetermined shape in the molded body producing step is not particularly limited and may be appropriately selected depending on the intended purpose. Examples of the method include an extrusion molding method and a die molding method.

It is preferable to perform the molded body producing step by filling a hollow die with the thermal conducting resin composition and thermally curing the thermal conducting resin composition, because random orientation of the insulating-coated carbon fibers is obtained in the thermal conducting sheet to be obtained.

Because of the random orientation of the insulating-coated carbon fibers in the thermal conducting sheet obtained, there is a lot of mutual intertwining of the insulating-coated carbon fibers, leading to a higher thermal conductivity than when the insulating-coated carbon fibers are oriented in a constant direction. Further, because of the random orientation of the insulating-coated carbon fibers, there are also a lot of contact points between the insulating-coated carbon fibers with the thermal conducting filler (for example, an inorganic filler) in addition to the mutual intertwining of the insulating-coated carbon fibers, leading to an even higher thermal conductivity than when the insulating-coated carbon fibers are oriented in a constant direction.

The extrusion molding method and the die molding method are not particularly limited and may be appropriately employed from various types of known extrusion molding methods and die molding methods depending on the viscosity of the thermal conducting resin composition and the properties required of the thermal conducting sheet to be obtained.

When the thermal conducting resin composition is extruded from a die in the extrusion molding method or when the thermal conducting resin composition is pressed into a die in the die molding method, for example, the binder resin fluidizes to cause some of the insulating-coated carbon fibers to be oriented along the fluidizing direction. However, many of the insulating-coated carbon fibers are randomly oriented.

When a slit is attached to the leading end of the die, there is a tendency that the insulating-coated carbon fibers are uniformly oriented in the width-direction center of the extruded molded block. On the other hand, there is a tendency that the insulating-coated carbon fibers are randomly oriented in the width-direction peripheries of the molded block due to the effect of the slit wall.

The size and shape of the molded body (a block-shaped molded body) can be determined depending on the required size of the thermal conducting sheet. Examples of the size and shape include a rectangular parallelepiped having a cross-section in which the vertical size is from 0.5 cm through 15 cm and the horizontal size is from 0.5 cm through 15 cm. The length of the rectangular parallelepiped may be determined according to necessity.

Curing of the thermal conducting resin composition in the molded body producing step is preferably thermal curing. The curing temperature in the thermal curing is not particularly limited, may be appropriately selected depending on the intended purpose, and is preferably from 60 degrees C. through 120 degrees C. when, for example, the binder resin contains a liquid silicone gel main agent and a curing agent. The curing time in the thermal curing is not particularly limited, may be appropriately selected depending on the intended purpose, and is, for example, from 0.5 hours through 10 hours.

<Molded Body Sheet Producing Step>

The molded body sheet producing step is not particularly limited and may be appropriately selected depending on the intended purpose so long as the molded body sheet producing step is a step of cutting the molded body into a sheet shape to obtain a sheet of the molded body. For example, the molded body sheet producing step can be performed with a slicing device.

In the molded body sheet producing step, the molded body is cut into a sheet shape, to obtain a sheet of the molded body. The insulating-coated carbon fibers are protruding on the surface of the obtained sheet of the molded body. This is considered due to that in cutting of the molded body into a sheet shape with, for example, the slicing device, the cured component of the binder resin is drawn and elongated by the cutting member of, for example, the slicing device due to the hardness difference between the cured component of the binder resin and the insulating-coated carbon fibers, so the cured component of the binder resin is removed from the surface of the insulating-coated carbon fibers in the surface of the sheet of the molded body.

The slicing device is not particularly limited and may be appropriately selected depending on the intended purpose. Examples of the slicing device include an ultrasonic cutter and a plane. The cutting direction along which the molded body is cut is preferably from 60 degrees through 120 degrees, more preferably from 70 degrees through 100 degrees, and particularly preferably 90 degrees (vertically) with respect to the extruding direction because there are components that are oriented along the extruding direction when the molding method is the extrusion molding method.

The average thickness of the sheet of the molded body is not particularly limited, may be appropriately selected depending on the intended purpose, and is preferably from 0.06 mm through 5.01 mm, more preferably from 0.08 mm through 4.01 mm, and particularly preferably from 0.11 mm through 3.01 mm.

<Surface Coating Step>

The surface coating step is not particularly limited and may be appropriately selected depending on the intended purpose so long as the surface coating step is a step of coating the surface of the sheet of the molded body with a bled-out component that bleeds out from the sheet of the molded body conformally to the bossed shapes of the insulating-coated carbon fibers that are protruding. Examples of the surface coating step include press processing and a treatment for leaving the sheet of the molded body standing.

Here, the "bled-out component" is a component that has been contained in the thermal conducting resin composition but has not contributed to the curing, and refers to, for example, a non-curable component and an uncured component of the binder resin.

—Press Processing—

The press processing is not particularly limited and may be appropriately selected depending on the intended purpose so long as the press processing is a process for pressing the sheet of the molded body to coat the surface of the sheet of the molded body with a bled-out component that bleeds out from the sheet of the molded body conformally to the bossed shapes of the insulating-coated carbon fibers that are protruding.

The press can be performed with, for example, a pair of press devices formed of a platen and a press head having a flat surface. The press may also be performed with a pinch roll.

The press pressure is not particularly limited, may be appropriately selected depending on the intended purpose, and is preferably from 0.1 MPa through 100 MPa and more preferably from 0.5 MPa through 95 MPa. This is because there is a tendency that when the pressure is too low, thermal resistance results in the same level as when the press is not performed, and because there is a tendency that when the pressure is too high, the sheet is elongated.

The press time is not particularly limited and may be appropriately selected depending on, for example, the component of the binder resin, the press pressure, the area of the sheet, and the bleeding amount of the bled-out component.

In order to even more promote the effects of bleeding of the bled-out component and coating of the surface of the sheet of the molded body, the press step may be performed under heating using a press head including a built-in heater. In order to enhance these effects, the heating temperature is preferably higher than or equal to the glass transition temperature of the binder resin. This can shorten the press time.

In the press step, the sheet of the molded body is pressed in order to cause the bled-out component to bleed out from the sheet of the molded body and coat the surface with the bled-out component. Therefore, the thermal conducting sheet to be obtained can have a better conformity and a better close adhesiveness with the surface of an electronic part and of a heat spreader and can have a lower thermal resistance. When the coating with the bled-out component has a thickness of a level that reflects the shape of the insulating-coated carbon fibers on the surface of the thermal conducting sheet, thermal resistance rise can be avoided.

With the press, the sheet of the molded body is compressed in the thickness direction and can be increased in the frequency of mutual contacts of the insulating-coated carbon fibers and of the thermal conducting filler. This can reduce the thermal resistance of the thermal conducting sheet.

It is preferable to perform the press step with the use of a spacer for compressing the sheet of the molded body to have a predetermined thickness. That is, for example, by the sheet of the molded body being pressed with the spacer placed on a placing surface that faces the press head, the thermal conducting sheet can be formed to have a predetermined sheet thickness corresponding to the height of the spacer.

—Treatment for Leaving Sheet of Molded Body Standing—

The treatment for leaving the sheet of the molded body standing is not particularly limited and may be appropriately selected depending on the intended purpose so long as it is a treatment for leaving the sheet of the molded body standing to let the surface of the sheet of the molded body be coated with the bled-out component that has bled out from the sheet of the molded body.

The treatment for coating the surface of the sheet of the molded body and the insulating-coated carbon fibers exposed on the surface of the sheet of the molded body with the bled-out component of the binder resin that has bled out from the sheet of the molded body may be the treatment for leaving the sheet of the molded body standing, instead of the press processing. Also in this case, the thermal conducting sheet to be obtained can have a better conformity and a better close adhesiveness with the surface of an electronic part and of a heat spreader and can have a lower thermal resistance, as in the case of the press processing. Further, when the coating with the bled-out component has a thickness of a level that reflects the shape of the insulating-coated carbon fibers on the surface of the thermal conducting sheet, thermal resistance rise can be avoided.

The standing time is not particularly limited and may be appropriately selected depending on the intended purpose.

<Insulating-Coated Carbon Fiber Producing Step>

The insulating-coated carbon fiber producing step is a step of applying an energy to a mixture to activate a polymerization initiator to form a coating film formed of a cured product of a polymerizable material over at least a part of a surface of carbon fibers, to thereby obtain the insulating-coated carbon fibers.

The mixture is obtained by mixing the polymerizable material, the carbon fibers, the polymerization initiator, and the solvent.

It is preferable that the mixture be being stirred when the energy is applied to the mixture.

By applying the energy to the mixture and activating the polymerization initiator, it is possible to form an insulating coating film having a desired thickness over the carbon fibers without causing mutual aggregation of the carbon fibers. Because a coating film having a better insulating property than that of existing coating films can be formed, the obtained insulating-coated carbon fibers can have a greatly improved insulating property while maintaining a high thermal conductivity.

—Polymerization Initiator—

The polymerization initiator is not particularly limited and may be appropriately selected depending on the intended purpose so long as the polymerization initiator can generate active species upon application of the energy and allow the polymerizable material to undergo polymerization.

When the polymerizable material is a radically polymerizable material, examples of the polymerization initiator include thermal polymerization initiators such as azo-compounds and organic peroxides, and ultraviolet polymerization initiators such as alkylphenone types and acylphosphine oxide types.

Examples of the energy include a thermal energy and a light energy.

That is, in the case of using a thermal energy as the energy, for example, the mixture is heated to equal to or higher than a thermal decomposition temperature of the thermal polymerization initiator, to thereby activate the thermal polymerization initiator and allow the polymerizable material to undergo polymerization. The thermal energy is applied to the mixture through, for example, heat transfer by thermal conduction.

In the case of using a light energy as the energy, for example, the mixture is irradiated with ultraviolet rays, to thereby activate the ultraviolet polymerization initiator and allow the polymerizable material to undergo polymerization.
—Solvent—
Examples of the solvent include an organic solvent and water.

Examples of the organic solvent include hexane, cyclohexane, diethyl ether, polyether (glyme), γ-butyrolactone, N-methylpyrrolidone, acetonitrile, tetrahydrofuran, ethyl acetate, xylene, toluene, benzene, dimethyl sulfoxide, acetone, methyl ethyl ketone, isopropyl alcohol, ethanol, and methanol.

Among these organic solvents, ethanol or a mixture of ethanol and isopropyl alcohol is preferable for use when divinylbenzene is used as the radically polymerizable material. Ethanol or a mixture of ethanol and toluene is preferable for used when a compound containing 2 or more (meth) acryloyl groups is used as the radically polymerizable material.
—Deaeration—
In the production of the insulating-coated carbon fibers, the mixture may be deaerated. This is for promoting surface wettability of the carbon fibers. The deaeration method is not particularly limited, and examples of the deaeration method include depressurization and a method using ultrasonic waves.
—Inerting—
In the production of the insulating-coated carbon fibers, inerting may be performed.

The inerting refers to a treatment for reducing the oxygen concentration.

This is for preventing a polymerization reaction described below from being inhibited by oxygen. The inerting method is not particularly limited and may be appropriately selected depending on the intended purpose. Examples of the inerting method include a method of supplying an inert gas such as nitrogen by bubbling while the mixture is being stirred, and a method of substituting nitrogen in a container by depressurization and nitrogen purge.
—Polymerization Reaction—
In the production of the insulating-coated carbon fibers, for example, a coating film formed of a cured product of the polymerizable material is formed over at least a part of the carbon fibers by, for example, applying an energy while the mixture is being stirred.

When the energy is a thermal energy, the temperature of the mixture during polymerization is preferably from 0 degrees C. through 200 degrees C., more preferably from 25 degrees C. through 150 degrees C., and particularly preferably from 50 degrees C. through 100 degrees C. This is because the coating film can be formed without fail and the insulating-coated carbon fibers having a high insulating property can be obtained.

In the insulating-coated carbon fiber producing step, it is preferable to lower the temperature (slow cooling) to room temperature after the polymerization reaction. This is for lowering the temperature of the solvent to precipitate the polymerized product dissolved in a trace amount in the solvent as the coating film. The slow cooling method is not particularly limited, and examples of the slow cooling method include a method of immersing the reaction container in a cooling tank with temperature management.

In the insulating-coated carbon fiber producing step, for example, before the polymerization reaction, the carbon fibers and the polymerizable material (monomer) are present in a dispersed/dissolved state in the solvent under stirring. After energy application, the monomer undergoes polymerization in the solution. After polymerization has progressed to the critical chain length for precipitation in the solvent, a polymer precipitates over the surface of the carbon fibers that serve as triggers (nuclei) for precipitation. In this case, the formed polymer, when seen on the whole, is insoluble in the solvent or, if soluble, very scarcely soluble. When a polymerizable group has remained in the precipitated polymer, the monomer is expected to undergo reaction and further cause precipitation and is expected to form a physically or chemically laminated layer. Subsequently, slow cooling is performed, which lowers the temperature in the reaction tank and reduces the solubility to the solvent, allowing an assumption that the polymer dissolved in a trace amount in the solvent also contributes to the polymer film thickness. By making the contribution mild, it is possible to reduce the risk of coalescing. The insulating-coated carbon fiber producing step enables formation of a more uniform coating film having a higher selectivity to the surface of the carbon fibers, compared with emulsion polymerization that results in an embedded state by a random phase separation. The formed insulating coating film has a higher insulating property than that of existing insulating coating films.

The polymerization reaction is a reaction for precipitating an insulating coating film formed of a polymerized product (cured product) over the carbon fibers, and is a reaction similar to precipitation polymerization. However, the polymerization reaction is different from the typical precipitation polymerization in that the polymerization reaction is not a mechanism that is mainly based on electrostatic pulling force/adsorption, absorption of the monomer and the initiator component, and binding by a functional group on the surface.

Further, in the insulating-coated carbon fiber producing step, after the slow cooling, the obtained insulating-coated carbon fibers may be settled.

Settling of the obtained insulating-coated carbon fibers facilitates separation from the solvent. Settling can be performed by leaving the reaction container standing still for a certain time after the slow cooling.
(Heat Dissipation Member)
A heat dissipation member of the present invention includes at least a heat spreader and a thermal conducting sheet, and further includes other members as needed.
(Semiconductor Device)
A semiconductor device of the present invention includes at least an electronic part, a heat spreader, and a thermal conducting sheet, and further includes other members as needed.

The electronic part is not particularly limited and may be appropriately selected depending on the intended purpose. Examples of the electronic part include a CPU, an MPU, and a graphic computing element.

The heat spreader is not particularly limited and may be appropriately selected depending on the intended purpose so long as the heat spreader is a member configured to dissipate heat generated by the electronic part.

The thermal conducting sheet is the thermal conducting sheet of the present invention, and is disposed on the heat spreader and interposed between the heat spreader and the electronic part.

An example of the semiconductor device of the present invention will be described with reference to the drawing.

FIG. 1 is a schematic cross-sectional view of an example of the semiconductor device of the present invention. A thermal conducting sheet 1 of the present invention is configured to dissipate heat generated by an electronic part 3 such as a semiconductor element, and as illustrated in FIG. 1, is fixed on a principal surface 2a of a heat spreader 2 facing the electronic part 3 and interposed between the electronic part 3 and the heat spreader 2. The thermal conducting sheet 1 is also interposed between the heat spreader 2 and a heat sink 5. Together with the heat spreader 2, the thermal conducting sheet 1 constitutes a heat dissipation member configured to dissipate heat of the electronic part 3.

The heat spreader 2 is formed in, for example, a square plate shape, and includes the principal surface 2a facing the electronic part 3 and a side wall 2b formed upright along the circumference of the principal surface 2a. In the heat spreader 2, the thermal conducting sheet 1 is provided on the principal surface 2a surrounded by the side wall 2b, and the heat sink 5 is provided on the other surface 2c opposite to the principal surface 2a with the thermal conducting sheet 1 interposed between the heat sink and the other surface. The head spreader 2 may be formed of, for example, copper or aluminum having a good thermal conductivity, because a higher thermal conductivity ensures a lower thermal resistance and a more efficient absorption of heat from the electronic part 3 such as a semiconductor element.

The electronic part 3 is, for example, a semiconductor element such as BGA, and is mounted on a wiring board 6. The end surface of the side wall 2b of the heat spreader 2 is also mounted on the wiring board 6. In this way, the electronic part 3 is surrounded by the side wall 2b with a predetermined distance secured.

Then, with the thermal conducting sheet 1 bonded to the principal surface 2a of the heat spreader 2, a heat dissipation member configured to absorb heat generated by the electronic part 3 and dissipate the heat through the heat sink 5 is formed. The heat spreader 2 and the thermal conducting sheet 1 may be bonded to each other by the own adhesive force of the thermal conducting sheet 1, but an adhesive may be used appropriately. As the adhesive, known heat dissipating resins or heat dissipating adhesive films that serve bonding and thermal conduction of the thermal conducting sheet 1 to the heat spreader 2 may be used.

Figure 2:
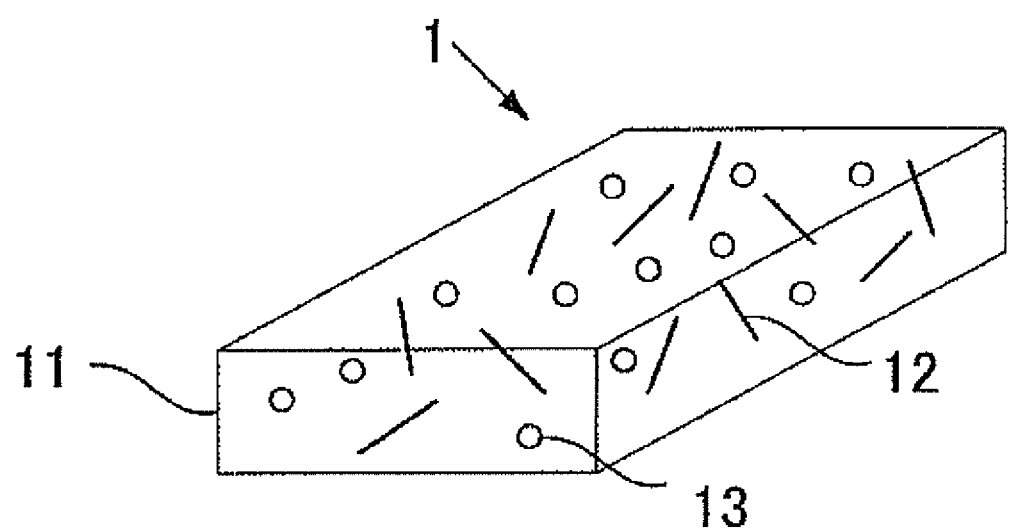
FIG. 2 depicts the thermal conducting sheet in accordance with the present invention.

FIG. 2 depicts the thermal conducting sheet 1 in accordance with the present invention. As shown in FIG. 2, the thermal conducting sheet 1 comprises a binder resin 11 with insulating carbon fibers 12 and thermal conducting fillers 13 dispersed therein.

EXAMPLES

Examples of the present invention will be described below. In Examples, samples of thermal conducting sheets were produced, and each sample was evaluated in various manners.

The present invention should not be construed as being limited to these Examples.

Production Example 1

<Production of Insulating-Coated Carbon Fibers>

Pitch-based carbon fibers having an average fiber diameter of 9 micrometers and an average fiber length of 100 micrometers (product name: XN-100-10M, available from Nippon Graphite Fiber Co., Ltd.) (100 g) and ethanol (450 g) were fed in a glass container and mixed with a stirring blade, to obtain a slurry liquid. While inerting was performed by adding nitrogen to the slurry liquid at a flow rate of 160 mL/min, divinylbenzene (93% divinylbenzene, available from Wako Pure Chemical Industries, Ltd.) (25 g) was added to the slurry.

Ten minutes after addition of divinylbenzene, a polymerization initiator (product name: V-65, an oil-soluble azo-polymerization initiator, available from Wako Pure Chemical Industries, Ltd.) (0.5 g) previously dissolved in ethanol (50 g) was fed to the slurry liquid. After feeding, the resultant was stirred for 5 minutes and then inerting by nitrogen was stopped.

Subsequently, the resultant was subjected to temperature increase under stirring, retained at a temperature of 70 degrees C., and then subjected to temperature decrease to 40 degrees C. The reaction time was from the start of temperature increase to the start of temperature decrease. After temperature decrease, the resultant was left to stand still for 15 minutes, to settle the solids dispersed in the slurry liquid. After settling, the supernatant was removed by decantation, and the resultant was stirred for 15 minutes with an additional solvent (750 g) to wash the solids.

After washing, the solids were collected by suction filtration, and the collected solids were dried at 100 degrees C. for 6 hours, to obtain insulating-coated carbon fibers.

Production Examples 2 to 8

<Production of Insulating-Coated Carbon Fibers>

Insulating-coated carbon fibers were obtained in the same manner as in Production example 1, except that unlike in Production example 1, the component combination was changed as presented in Table 2-1 and Table 2-2.

Comparative Production Example 1

<Production of Insulating-Coated Carbon Fibers>

Pitch-based carbon fibers having an average fiber diameter of 9 micrometers and an average fiber length of 100 micrometers (product name: XN-100-10M, available from Nippon Graphite Fiber Co., Ltd.) (100 g), tetraethoxysilane (TEOS) (200 g), and ethanol (900 g) were fed in a polyethylene container and mixed with a stirring blade.

Subsequently, with heating up to 50 degrees C., a reaction initiator (10% ammonia water) (176 g) was fed to the resultant for 5 minutes. The resultant was stirred for 3 hours as counted from 0 minutes, which was the timing at which solvent feeding was completed.

After stirring was completed, the resultant was subjected to temperature decrease, and solids were collected by suction filtration, washed with water and ethanol, and collected again by suction filtration.

The collected solids were dried at 100 degrees C. for 2 hours and further fired at 200 degrees C. for 8 hours, to obtain insulating-coated carbon fibers.

(Evaluation)

The insulating-coated carbon fibers obtained in Production examples 1 to 8 and Comparative production example 1 were evaluated in the manners described below. For resistance, evaluation of the following carbon fibers that were not insulating-coated was also performed. Evaluation results are presented in Table 2-1 and Table 2-2.

Comparative Sample 1:

Pitch-based carbon fibers having an average fiber diameter of 9 micrometers and an average fiber length of 100 micrometers (product name: XN-100-10M: available from Nippon Graphite Fiber Co., Ltd.)

Comparative Sample 2:

Pitch-based carbon fibers having an average fiber diameter of 9 micrometers and an average fiber length of 150 micrometers (product name: XN-100-15M: available from Nippon Graphite Fiber Co., Ltd.)

(1) Yield

The mass of each sample of the insulating-coated carbon fibers was measured. Subsequently, the mass was divided by the mass of the carbon fibers used, to thereby calculate the yield. As the calculated yield was higher, it can be understood that the coating amount was higher.

(2) Film Thickness of Coating Film

Each sample of the insulating-coated carbon fibers was cut with a focused ion beam (FIB), and the cross-section was observed with a transmission electron microscope (TEM) to measure the average film thickness of coating.

(3) Resistance of Coated Carbon Fibers

After each sample of the insulating-coated carbon fibers was fed in a tubular container (with a diameter of 9 mm and a length of 15 mm) at a filling density of 0.750 g/cm$^3$, resistance of the sample with respect to applied voltage variation was measured by a two-terminal method, using a high resistance measuring instrument. Note, however, that resistance of the carbon fibers that were not insulating-coated was measured in an applied voltage range in which the maximum was 10 V by a four-terminal method, using a low resistance measuring instrument.

A sample having a very high resistance value that exceeded the measurement range (see Table 1) was indicated in Table 2-1 and Table 2-2 as "Over Range". The measurable ranges were as follows.

TABLE 1

|  |  | Measurable range |
|---|---|---|
| Resistance ($\Omega$) | Measurement voltage of 1 V | $1.0 \times 10^3$ or higher but lower than $1.0 \times 10^{11}$ |
|  | Measurement voltage of 10 V | $1.0 \times 10^3$ or higher but lower than $1.0 \times 10^{11}$ |
|  | Measurement voltage of 50 V | $1.0 \times 10^6$ or higher but lower than $1.0 \times 10^{12}$ |
|  | Measurement voltage of 100 V | $1.0 \times 10^6$ or higher but lower than $1.0 \times 10^{12}$ |
|  | Measurement voltage of 250 V | $1.0 \times 10^6$ or higher but lower than $1.0 \times 10^{12}$ |
|  | Measurement voltage of 500 V | $1.0 \times 10^7$ or higher but lower than $1.0 \times 10^{13}$ |
|  | Measurement voltage of 1,000 V | $1.0 \times 10^8$ or higher but lower than $1.0 \times 10^{15}$ |

TABLE 2-1

|  |  |  | Production example |  |  |  |  | Comp. production example | Comp. sample |  |
|---|---|---|---|---|---|---|---|---|---|---|
|  |  |  | 1 | 2 | 3 | 4 | 5 | 1 | 1 | 2 |
| Component combination (g) | Carbon fibers | XN-100-10M | 100 |  |  |  | 100 | 100 | XN-100-10M | XN-100-15M |
|  |  | XN-100-12M |  | 100 |  | 100 |  |  |  |  |
|  |  | XN-100-15M |  |  | 100 |  |  |  |  |  |
|  | Monomer | Divinylbenzene | 25 | 25 | 25 | 15 |  |  |  |  |
|  |  | Light ester EG |  |  |  |  | 25 |  |  |  |
|  |  | TEOS |  |  |  |  |  | 200 |  |  |
|  | Initiator | V-65 | 0.5 | 0.5 | 0.5 | 0.4 | 0.5 |  |  |  |
|  |  | 10% NH$_3$ aqueous solution |  |  |  |  |  | 176 |  |  |
|  | Solvent | Ethanol | 500 | 500 | 500 | 500 | 500 | 900 |  |  |
| Reaction conditions | Temperature (degree C.) |  | 70 | 70 | 70 | 70 | 70 | 50 | — | — |
|  | Time (hr) |  | 4 | 4 | 4 | 4 | 4 | 4 | — | — |
| Evaluation | Yield |  | 107% | 108% | 107% | 105% | 117% | 107% | — | — |
|  | TEM film thickness (N = 2 Ave.) |  | 213 | 261 | 253 | 120 | 300 | 86 | — | — |
|  | Aggregation |  | Absent | Absent | Absent | Absent | Absent | Absent | Absent | Absent |
|  | Resistance $\Omega$ | 10 V |  |  | Over Range |  |  | 1.03E+10 | 3.98E−01 | 1.56E−02 |
|  |  | 100 V |  |  | Over Range |  |  | 7.31E+09 |  |  |
|  |  | 500 V |  |  | Over Range |  |  | 1.65E+09 |  |  |
|  |  | 1,000 V | 6.08E+13 | 2.74E+14 | 1.33E+12 | 2.70E+12 | 7.23E+13 | 6.02E+08 |  |  |

TABLE 2-2

|  |  |  | Production example 6 | Production example 7 | Production example 8 |
|---|---|---|---|---|---|
| Component combination (g) | Carbon fibers | XN-100-10M |  |  |  |
|  |  | XN-100-12M | 100 | 100 | 100 |
|  |  | XN-100-15M |  |  |  |
|  | Monomer | Divinylbenzene | 25 | 25 | 25 |
|  |  | Light ester EG |  |  |  |
|  |  | TEOS |  |  |  |
|  | Initiator | V65 | 0.5 | 0.5 | 0.5 |
|  |  | 10% NH$_3$ aqueous solution |  |  |  |
|  | Solvent | Ethanol | 500 | 500 | 500 |

TABLE 2-2-continued

|  |  | Production example 6 | Production example 7 | Production example 8 |
|---|---|---|---|---|
| Reaction conditions | Temperature (degree C.) | 70 | 70 | 70 |
|  | Time (hr) | 4.5 | 5 | 5.5 |
| Evaluation | Yield | 108% | 109% | 108% |
|  | TEM film thickness (nm) | 302 | 325 | 396 |
|  | Aggregation | Absent | Absent | Absent |
| Resistance Ω | 10 V |  | Over Range |  |
|  | 100 V |  | Over Range |  |
|  | 500 V |  | Over Range |  |
|  | 1,000 V | 3.03E+13 | 4.62E+13 | 3.61E+14 |

In Table 2-1 and Table 2-2, "E" represents "exponent of 10". That is, "1E+3" represents "1,000" and "1E-1" represents "0.1". In Table 4-1, Table 4-2, and Table 4-3, the same applies.

XN-100-10M: pitch-based carbon fibers having an average fiber diameter of 9 micrometers and an average fiber length of 100 micrometers, available from Nippon Graphite Fiber Co., Ltd.

XN-100-12M: pitch-based carbon fibers having an average fiber diameter of 9 micrometers and an average fiber length of 120 micrometers, available from Nippon Graphite Fiber Co., Ltd.

XN-100-15M: pitch-based carbon fibers having an average fiber diameter of 9 micrometers and an average fiber length of 150 micrometers, available from Nippon Graphite Fiber Co., Ltd.

Light ester EG: ethylene glycol dimethacrylate, available from Kyoeisha Chemical Co., Ltd.

Example 1

The components in the following component combination were mixed, to prepare a silicone resin composition (thermal conducting resin composition).
—Component Combination—
—Component Combination 1 (100% by Volume in Total)—

| Insulating-coated carbon fibers of Production example 1 | 22.34% by volume |
|---|---|
| Alumina | 20.66% by volume |

(Product name: DAW03, with an average particle diameter of 4 micrometers, available from Denka Company Limited)

| Aluminum nitride | 23.84% by volume |
|---|---|

(Product name: H1, with an average particle diameter of 1 micrometer, available from Tokuyama Corporation)

| Silicone resins | 33.15% by volume |
|---|---|

The silicone resins were as follows.
—Silicone Resins—

| Silicone resin A | 57% by mass |
|---|---|

(Product name: 527(A), available from Dow Corning Toray Co., Ltd.)

| Silicone resin B | 43% by mass |
|---|---|

(Product name: 527(B), available from Dow Corning Toray Co., Ltd.)

The obtained silicone resin composition was extruded into a rectangular-parallelepiped die (42 mm×42 mm) having a releasably-treated PET film pasted on the internal wall, to thereby mold a silicone molded body. The obtained silicone molded body was cured in an oven at 100 degrees C. for 6 hours, to obtain a silicone cured product.

The obtained silicone cured product was heated in an oven at 100 degrees C. for 1 hour, and then cut with an ultrasonic cutter, to thereby obtain a sheet of the molded body having a thickness of 2.05 mm. The slicing speed of the ultrasonic cutter was 50 mm per second. Ultrasonic vibration to be applied to the ultrasonic cutter was set to an oscillation frequency of 20.5 kHz and an amplitude of 60 micrometers.

The obtained sheet of the molded body was sandwiched between releasably-treated PET films, and pressed with a spacer having a thickness of 1.98 mm inserted, to thereby obtain a thermal conducting sheet sample having a thickness of 2.00 mm. The press conditions were 50 degrees C., 0.5 MPa, and 3 minutes. The filler recognized on the surface immediately after slicing was not coated with the binder. By the press, the filler was pressed against the sheet and indented into the sheet, to cause the binder component to be exposed to the surface. Therefore, the binder coated the filler, reflecting the filler shape on the sheet surface. After the press, the binder component was recognized on the surface of the released PET that had contacted the sheet.

<Evaluation>

The following evaluations were performed. The results are presented in Table 4-1.

<<Thermal properties (effective thermal conductivity, thermal resistance, and compressibility)>>

Measurement of thermal properties was performed with a thermal resistance measuring instrument (available from Dexerials Corporation) compliant with ASTM-D5470.

Effective thermal conductivity was a thermal conductivity in a thickness direction.

Each property was measured under a load of 0.5 kgf/cm$^2$.

<<Electric Properties (Volume Resistivity and Breakdown Voltage)>>

—Volume Resistivity—

Volume resistivity with respect to applied voltage variation was measured with a resistance measuring instrument (available from Mitsubishi Chemical Analytech Co., Ltd., HIRESTA-UX).

A sample having a very high resistance value that exceeded the measurement range (see Table 1) was indicated in Table 4-1, Table 4-2, and Table 4-3 as "Over Range" or "O.R.". A sample having a very low resistance value that fell below the measurement range (see Table 1) was indicated in Table 4-1, Table 4-2, and Table 4-3 as "Under Range".

Because the measurement range of volume resistivity was based on the measurement range of a resistance value, the unit of the measurement range in Table 1 was Ω.

—Breakdown Voltage—

A breakdown voltage was measured with an ultrahigh-voltage breakdown voltage tester (available from Keisoku Giken Co., Ltd., 7473) at a voltage increasing rate of 0.05 kV/second at room temperature. The voltage at which a breakdown occurred was the breakdown voltage (kV or kV/mm).

Examples 2 to 7 and Comparative Examples 1 to 4

Thermal conducting sheets were produced in the same manner as in Example 1, except that unlike in Example 1, the components in the component combination were changed as presented in Table 3-1, Table 4-1, and Table 4-2.

The obtained thermal conducting sheets were evaluated in the same manners as in Example 1. The results are presented in Table 4-1 and Table 4-2.

Examples 8 to 15

Thermal conducting sheets were produced in the same manner as in Example 1, except that unlike in Example 1, the components in the component combination and the sheet thickness were changed as presented in Table 3-2 and Table 4-3.

The obtained thermal conducting sheets were evaluated in the same manners as in Example 1. The results are presented in Table 4-3.

TABLE 3-1

| | | Ex. | | | | | | | Comp. Ex. | | | |
|---|---|---|---|---|---|---|---|---|---|---|---|---|
| Silicone resin | | 1 | 2 | 3 | 4 | 5 | 6 | 7 | 1 | 2 | 3 | 4 |
| 527(A) | % by mass | 57 | | 56 | 50 | 56 | 56 | 56 | 56 | 57 | 57 | 56 |
| 527(B) | | 43 | | 44 | 50 | 44 | 44 | 44 | 44 | 43 | 43 | 44 |
| CY52-276(A) | | | 50 | | | | | | | | | |
| CY52-276(B) | | | 50 | | | | | | | | | |

TABLE 3-2

| | | Ex. | | | | | | | |
|---|---|---|---|---|---|---|---|---|---|
| Silicone resin | | 8 | 9 | 10 | 11 | 12 | 13 | 14 | 15 |
| 527(A) | % by mass | 57 | 57 | 57 | 57 | 57 | 57 | 57 | 57 |
| 527(B) | | 43 | 43 | 43 | 43 | 43 | 43 | 43 | 43 |

527(A): silicone resin, available from Dow Corning Toray Co., Ltd.

527(B): silicone resin, available from Dow Corning Toray Co., Ltd.

CY52-276(A): silicone resin, available from Dow Corning Toray Co., Ltd.

CY52-276(B): silicone resin, available from Dow Corning Toray Co., Ltd.

TABLE 4-1

| | | | Ex. | | | | | |
|---|---|---|---|---|---|---|---|---|
| | | | 1 | 2 | 3 | 4 | 5 | 6 |
| Component combination 1 (% by volume) | Carbon fibers | Production Ex. 1 | 22.34 | 22.86 | 23.07 | — | — | — |
| | | Production Ex. 2 | — | — | — | 23.07 | — | — |
| | | Production Ex. 3 | — | — | — | — | 23.07 | — |
| | | Production Ex. 4 | — | — | — | — | — | 23.07 |
| | | Production Ex. 5 | — | — | — | — | — | — |
| | | Comp. Production Ex. 1 | — | — | — | — | — | — |
| | | XN-100-10M | — | — | — | — | — | — |
| | | XN-100-15M | — | — | — | — | — | — |
| | Alumina | DAW03 | 20.66 | 21.15 | 42.69 | 42.69 | 42.69 | 42.69 |
| | Aluminum nitride | H1 | 23.84 | 24.40 | — | — | — | — |
| | Silicone resin | | 33.15 | 31.59 | 34.24 | 34.24 | 34.24 | 34.24 |
| | Total (% by volume) | | 100.00 | 100.00 | 100.00 | 100.00 | 100.00 | 100.00 |
| Thermal properties | Effective thermal conductivity | [W/mK] | 9.81 | 14.01 | 9.70 | 10.03 | 12.04 | 12.79 |
| | Thermal resistance | [° C. · cm²/W] | 1.48 | 1.33 | 1.89 | 1.87 | 1.50 | 1.37 |
| | Compressibility | [%] | 27.61 | 8.98 | 7.30 | 8.68 | 9.02 | 12.79 |
| Electric properties | Volume resistivity [(Ω · cm)] | 1 V | | | Over Range | | | |
| | | 10 V | | | Over Range | | | |
| | | 50 V | | | Over Range | | | |
| | | 100 V | | | Over Range | | | |
| | | 250 V | | | Over Range | | | |
| | | 500 V | | | Over Range | | | |
| | | 1,000 V | 7.62E+12 | 2.63E+12 | 5.38E+13 | 9.54E+12 | 5.97E+12 | 4.53E+11 |
| | Breakdown voltage | [kV] | 1.6 | 1.7 | 1.9 | 1.7 | 1.6 | 1.3 |
| | | [kV/mm] | 0.80 | 0.86 | 0.95 | 0.85 | 0.80 | 0.65 |

TABLE 4-2

|  |  |  | Ex. | Comp. Ex. | | | |
|---|---|---|---|---|---|---|---|
|  |  |  | 7 | 1 | 2 | 3 | 4 |
| Component combination 1 (% by volume) | Carbon fibers | Production Ex. 1 | — | — | — | — | — |
|  |  | Production Ex. 2 | — | — | — | — | — |
|  |  | Production Ex. 3 | — | — | — | — | — |
|  |  | Production Ex. 4 | — | — | — | — | — |
|  |  | Production Ex. 5 | 23.07 | — | — | — | — |
|  |  | Comp. Production Ex. 1 | — | — | — | — | 2 |
|  |  | XN-100-10M | — | 22.34 | 23.07 | — | — |
|  |  | XN-100-15M | — | — | — | 23.07 | — |
|  | Alumina | DAW03 | 42.69 | 20.66 | 42.68 | 42.68 | 42.69 |
|  | Aluminum nitride | H1 | — | 23.84 | — | — | — |
|  | Silicone resin |  | 34.24 | 33.15 | 34.24 | 34.24 | 34.24 |
|  | Total (% by volume) |  | 100.00 | 100.00 | 100.00 | 100.00 | 100.00 |
| Thermal properties | Effective thermal conductivity | [W/mK] | 10.03 | 17.21 | 15.71 | 15.30 | 11.91 |
|  | Thermal resistance | [°C · cm$^2$/W] | 1.87 | 0.85 | 1.16 | 0.86 | 1.30 |
|  | Compressibility | [%] | 8.68 | 27.14 | 9.71 | 36.38 | 25.18 |
| Electric properties | Volume resistivity [(Ω · cm)] | 1 V | O.R. | 4.40E+04 | 2.51E+04 | 1.20E+03 | O.R. |
|  |  | 10 V | O.R. | — | Under Range | — | O.R. |
|  |  | 50 V | O.R. | — | Under Range | — | O.R. |
|  |  | 100 V | O.R. | — | Under Range | — | O.R. |
|  |  | 250 V | O.R. | — | Under Range | — | O.R. |
|  |  | 500 V | O.R. | — | Under Range | — | 5.42E+11 |
|  |  | 1,000 V | 3.43E+14 | — | Under Range | — | 5.62E+09 |
|  | Breakdown voltage | [kV] | 2.6 | 0.04 | 0.04 | 0.04 | 0.91 |
|  |  | [kV/mm] | 1.30 | 0.02 | 0.02 | 0.02 | 0.45 |

TABLE 4-3

|  |  |  | Ex. | | | | | | | |
|---|---|---|---|---|---|---|---|---|---|---|
|  |  |  | 8 | 9 | 10 | 11 | 12 | 13 | 14 | 15 |
| Component combination 1 (% by volume) | Carbon fibers | Production Ex. 6 | 23.07 | | | | | | | |
|  |  | Production Ex. 7 |  | 23.07 | | | | | | |
|  |  | Production Ex. 8 |  |  | 23.07 | 23.07 | 23.07 | 23.07 | 23.07 | 3.22 |
|  | Alumina | DAW03 | 42.69 | 42.69 | 42.69 | 42.69 | 42.69 | 42.69 | 42.69 | 53.70 |
|  | Silicone resin |  | 34.24 | 34.24 | 34.24 | 34.24 | 34.24 | 34.24 | 34.24 | 43.08 |
|  | Total (% by volume) |  | 100.00 | 100.00 | 100.00 | 100.00 | 100.00 | 100.00 | 100.00 | 100.00 |
|  | Thermal conducting filler content ratio (% by volume) |  | 65.76 | 65.76 | 65.76 | 65.76 | 65.76 | 65.76 | 65.76 | 56.92 |
|  | Sheet thickness [mm] |  | 2.0 | 2.0 | 1.0 | 1.5 | 2.0 | 2.5 | 3.0 | 0.45 |
| Thermal properties | Effective thermal conductivity | [W/m · K] | 9.12 | 9.11 | 7.15 | 7.92 | 8.79 | 10.16 | 10.62 | 1.12 |
|  | Thermal resistance | [°C · cm$^2$/W] | 2.14 | 2.13 | 1.38 | 1.85 | 2.21 | 2.32 | 2.65 | 3.29 |
|  | Compressibility | [%] | 4.28 | 4.01 | 4.12 | 3.54 | 4.31 | 8.5 | 7.43 | 18.2 |
| Electric properties | Volume resistivity Ω · cm | 1 V |  |  |  |  | Over Range | | | |
|  |  | 10 V |  |  |  |  | Over Range | | | |
|  |  | 50 V |  |  |  |  | Over Range | | | |
|  |  | 100 V |  |  |  |  | Over Range | | | |
|  |  | 250 V |  |  |  |  | Over Range | | | |
|  |  | 500 V |  |  |  |  | Over Range | | | |
|  |  | 1,000 V | 1.09E+13 | 2.76E+13 | 3.02E+12 | 3.25E+13 | 2.75E+13 | 2.53E+13 | 1.90E+13 | 1.13E+12 |
|  | Breakdown voltage | [kV] | 2.1 | 2.2 | 1.0 | 1.3 | 2.0 | 2.6 | 3.0 | 0.5 |
|  |  | [kV/mm] | 1.06 | 1.12 | 1.02 | 0.89 | 0.98 | 1.05 | 1.00 | 1.18 |

The thermal conducting sheets of Examples 1 to 15 had a high thermal conductivity and a volume resistivity of $1.0 \times 10^{10}$ Ω·cm or higher at an applied voltage of 1,000 V, and exhibited a higher insulating property than that of the thermal conducting sheet of Comparative Example 4 in which carbon fibers were coated with silica. These thermal conducting sheets were also better than Comparative Example 4 in breakdown voltage.

Moreover, good properties were exhibited also when the insulating-coating thickness and the sheet thickness of the carbon fibers were changed.

REFERENCE SIGNS LIST

1: thermal conducting sheet
2: heat spreader
2a: principal surface

3: electronic part
3a: upper surface
5: heat sink
6: wiring board

The invention claimed is:

1. A thermal conducting sheet, comprising:
a binder resin, wherein the binder resin comprises a thermosetting polymer;
insulating-coated carbon fibers; and
a thermal conducting filler other than the insulating-coated carbon fibers,
wherein the insulating carbon fibers are dispersed in the binder resin,
wherein the thermal conducting filler is dispersed in the binder resin,
wherein the insulating-coated carbon fibers comprise carbon fibers and a coating film over at least a part of a surface of the carbon fibers, the coating film being formed of a cured product of a polymerizable material,
wherein the polymerizable material forming the coating film comprises a compound that comprises 2 or more radically polymerizable double bonds and is one selected from the group consisting of divinyl benzene and compounds containing 2 or more (meth)acryloyl groups.

2. The thermal conducting sheet according to claim 1, wherein an average thickness of the coating film observed when a cross-section of the coating film is observed with a TEM is from 100 nm through 1,000 nm.

3. The thermal conducting sheet according to claim 1, wherein a volume resistivity of the thermal conducting sheet at an applied voltage of 1,000 V is from $1.0 \times 10^{10} \Omega \cdot cm$ through $1.0 \times 10^{18} \Omega \cdot cm$.

4. The thermal conducting sheet according to claim 1, wherein a compressibility of the thermal conducting sheet at a load of 0.5 kgf/cm$^2$ is from 3% through 30%.

5. The thermal conducting sheet according to claim 1, wherein the thermal conducting filler comprises at least any one selected from the group consisting of aluminum oxide, aluminum nitride, and zinc oxide.

6. The thermal conducting sheet according to claim 1, wherein the binder resin is a silicone resin.

7. A heat dissipation member, comprising:
a heat spreader configured to dissipate heat generated by an electronic part; and
the thermal conducting sheet according to claim 1 provided on the heat spreader and interposed between the heat spreader and the electronic part.

8. A semiconductor device, comprising:
an electronic part;
a heat spreader configured to dissipate heat generated by the electronic part; and
the thermal conducting sheet according to claim 1 provided on the heat spreader and interposed between the heat spreader and the electronic part.

9. The semiconductor device according to claim 8, further comprising:
a heat sink,
wherein a thermal conducting sheet is interposed between the heat spreader and the heat sink.

10. The thermal conducting sheet according to claim 1, wherein the polymerizable material is divinylbenzene.

11. The thermal conducting sheet according to claim 1, wherein an average thickness of the thermal conducting sheet is from 0.05 mm through 5.00 mm.

12. The thermal conducting sheet according to claim 1, wherein a content of the binder resin is from 10% by volume through 50% by volume relative to the thermal conducting sheet.

13. The thermal conducting sheet according to claim 1, wherein a content of the insulating-coated carbon fibers is from 10% by volume through 40% by volume relative to the thermal conducting sheet.

14. The thermal conducting sheet according to claim 1, wherein a content of the thermal conducting filler is from 25% by volume through 65% by volume relative to the thermal conducting sheet.

15. The thermal conducting sheet according to claim 1, wherein a content of the binder resin in the thermal conducting sheet is from 10% by volume through 50% by volume relative to the thermal conducting sheet;
wherein a content of the insulating-coated carbon fibers is from 10% by volume through 40% by volume relative to the thermal conducting sheet, and
where a content of the thermal conducting filler is from 25% by volume through 65% by volume relative to the thermal conducting sheet.

* * * * *